(12) United States Patent
Reichert et al.

(10) Patent No.: US 7,442,582 B2
(45) Date of Patent: Oct. 28, 2008

(54) METHOD FOR PRODUCING A CHIP-SUBSTRATE CONNECTION

(75) Inventors: Hans-Jörg Reichert, München (DE); Margarete Deckers, München (DE); Rainer Zanner, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/842,656

(22) Filed: Aug. 21, 2007

(65) Prior Publication Data

US 2007/0278279 A1    Dec. 6, 2007

Related U.S. Application Data

(60) Division of application No. 09/483,737, filed on Jan. 14, 2000, which is a continuation of application No. PCT/DE98/01737, filed on Jun. 24, 1998.

(51) Int. Cl.
*H01L 21/00* (2006.01)
*B23K 1/00* (2006.01)
*B23K 1/19* (2006.01)

(52) U.S. Cl. .................... 438/123; 228/262.9

(58) Field of Classification Search ............ 438/123; 228/262.9
See application file for complete search history.

(56) References Cited

U.S. PATENT DOCUMENTS

| | | | |
|---|---|---|---|
| 4,214,904 A | 7/1980 | Kitchen et al. |
| 4,634,638 A | 1/1987 | Ainslie et al. |
| 4,772,935 A | 9/1988 | Lawler et al. |
| 4,791,075 A | 12/1988 | Lin |
| 4,875,617 A | 10/1989 | Citowsky |
| 5,106,009 A | 4/1992 | Humpston et al. |
| 5,135,890 A | 8/1992 | Temple et al. |
| 5,182,632 A | 1/1993 | Bechtel et al. |
| 5,197,654 A | 3/1993 | Katz et al. |
| 5,234,153 A | 8/1993 | Bacon et al. |
| 5,297,333 A | 3/1994 | Kusaka |
| 5,298,735 A | 3/1994 | Peterson et al. |
| 5,585,138 A | 12/1996 | Inasaka |
| 5,601,675 A | 2/1997 | Hoffmeyer et al. |
| 5,620,131 A | 4/1997 | Kane et al. |
| 5,631,675 A | 5/1997 | Futagawa |
| 5,917,200 A | 6/1999 | Kurata |
| 5,943,553 A | 8/1999 | Spaeth |
| 6,027,957 A | 2/2000 | Merritt et al. |
| 6,049,130 A | 4/2000 | Hosomi et al. |
| 6,223,429 B1 | 5/2001 | Kaneda et al. |
| 6,245,208 B1 | 6/2001 | Ivey et al. |
| 6,300,673 B1 | 10/2001 | Hoffman et al. |
| 6,338,893 B1 | 1/2002 | Kodera et al. |
| 6,426,548 B1 | 7/2002 | Mita et al. |

FOREIGN PATENT DOCUMENTS

| | | |
|---|---|---|
| DE | 195 32 250 A1 | 3/1997 |
| EP | 0 186 585 A2 | 7/1986 |
| EP | 0 517 369 A2 | 12/1992 |
| EP | 0 517 369 A3 | 12/1992 |
| JP | 59-207643 | 11/1954 |
| JP | 54022162 A | 2/1979 |
| JP | 54022164 A | 2/1979 |
| JP | 55006839 | 1/1980 |
| JP | 61-101061 | 5/1986 |
| JP | 61-150251 | 7/1986 |
| JP | 63-136533 | 6/1988 |
| JP | 01239982 | 9/1989 |
| JP | 2-15897 A | 1/1990 |
| JP | 5-69190 | 3/1993 |
| JP | 5-308085 | 11/1993 |
| JP | 6-7990 | 1/1994 |
| JP | 6-126485 | 5/1994 |
| JP | 6-291239 | 10/1994 |
| JP | 6-326210 | 11/1994 |
| JP | 7-254780 | 10/1995 |
| WO | 88/03705 | 5/1988 |
| WO | 96/42107 | 12/1996 |

OTHER PUBLICATIONS

Albrecht, H.J.: "Alternative Lotwerkstoffe für Elektronikbaugruppen", Siemens-Zeitschrift Special, 1996, pp. 14-16.

(Continued)

*Primary Examiner*—Evan Pert
(74) *Attorney, Agent, or Firm*—Laurence A. Greenberg; Werner H. Stemer; Ralph E. Locher

(57) ABSTRACT

A method and an apparatus for producing a chip-substrate connection by alloying or brazing, using a solder containing two or more components with at least two metal-containing constituents X and Y. The first constituent X contains in particular gold or a similar precious metal, and the second constituent Y being consumed in the soldering operation by reacting or being dissolved in the materials or layers which are to be joined. The solder has a hypereutectic concentration of the second constituent Y. The invention furthermore relates to a solder for the production of a chip-substrate connection, and to a semiconductor component with a semiconductor chip which is secured to a substrate by alloying or brazing.

18 Claims, 1 Drawing Sheet

OTHER PUBLICATIONS

Zimmermann, D.D.: A New Gold-Tin Alloy Composition for Heretic Package Sealing and Attachment of Hybrid Parts, Solid State Technology, vol. 15,. No. 1, Jan. 1972, pp. 44-46.

Lee et al.: "A low temperature bonding process using deposited gold-tin composites", Thin Solid Films, Feb. 1992, No. 2, Lausanne, Switzerland, pp. 202-209.

Lee et al.: "A New Bonding Technology Using Gold and Tin Multilayer Composite Structures", IEEE Transactions on Components, Hybrids, and Manufacturing Technology, vol. 14, No. 2, Jun. 1991, pp. 407-412.

Matijasevic et al.: "Au-Sn alloy phase diagram and properties related to its use as a bonding medium", Thin Solid Films, Feb. 1993, No. 2, Lausanne, Switzerland, pp. 276-287.

METHOD FOR PRODUCING A CHIP-SUBSTRATE CONNECTION

CROSS-REFERENCE TO RELATED APPLICATIONS

This is a division of application Ser. No. 09/483,737, filed Jan. 14, 2000; which was a continuing application, under 35 U.S.C. §120, of International application PCT/DE98/01737, filed Jun. 24, 1998; the application also claims the priority, under 35 U.S.C. §119, of German patent application DE 197 30 118.5, filed Jul. 14, 1997; the prior applications are herewith incorporated by reference in their entirety.

BACKGROUND OF THE INVENTION

Field of the Invention

The invention relates to a method and an apparatus for producing a chip-substrate connection by alloying or brazing, using a solder with a two metal-containing constituents X and Y, the first constituent X containing in particular gold or a similar precious metal. The invention furthermore relates to a solder for the production of a chip-substrate connection, and to a semiconductor component with a semiconductor chip which is secured to a substrate by alloying or brazing.

When a rear side of a semiconductor chip is joined to a substrate, which is usually referred to as chip or die bonding, the requirements with regard to sufficient mechanical fixing and also good thermal and electrical conductivity must be fulfilled individually or jointly, depending on the application. An important factor is the compatibility of the chip and the substrate, that is to say the matching of the two participants in the joint in terms of their expansion behavior under thermal loading. At the present time, essentially three distinguishable methods of chip securing are customary: alloying (brazing), soldering (soft soldering), and bonding. The preferred area of application according to the present invention is alloying or brazing; in a known bonding method in the AuSi system, a eutectic joint between the semiconductor chip and the substrate is produced at the lowest melting temperature of the participants in the joint. Alloy formation takes place at a temperature that lies well below the melting temperature of the individual components Au and Si. This temperature is not high enough to damage the semiconductor structure and therefore the electrical function. During the alloying operation, the chip and the substrate are heated to this temperature, with a slight pressure being applied and with the chip being rubbed on in a circular movement in order to improve the contact. When the melting point in accordance with the liquidus-solidus curve of the phase diagram is reached, the solder becomes liquid, and the bonding process commences. For reasons of cost, the heating operation generally takes place very quickly, and does not go beyond thermodynamic equilibrium states. In contrast, the cooling operation takes place significantly more slowly. First, the component that is present in excess crystallizes out, until, at the solidification point, the eutectic mixing ratio is reached once again. During solidification of the eutectic molten material, the two components crystallize separately, so that the microstructure of the solidified eutectic reveals uniformly distributed Si and Au crystals.

The likelihood of the chip breaking is minimized by providing a chip-substrate connection which is as uniform as possible over a large surface area and by low internal stresses. The quality of the joint is controlled by the flow properties of the solder, and the internal stress is controlled by the temperature difference between solder solidification and temperature of use.

SUMMARY OF THE INVENTION

It is accordingly an object of the invention to provide a method and an apparatus for producing a chip-substrate connection which overcome the above-mentioned disadvantages of the prior art methods and devices of this general type, in which the risk of a chip breaking is as low as possible.

With the foregoing and other objects in view there is provided, in accordance with the invention, a method for producing a chip-substrate connection, which includes performing one of alloying and brazing a chip to a substrate using a solder containing at least two components with at least two metal-containing constituents including a first constituent X containing a precious metal and a second constituent Y being consumed in a soldering operation by one of reacting and being dissolved by materials being joined, and the solder having a hypereutectic concentration of the second constituent Y.

According to the invention, the solder has a hypereutectic concentration of the second constituent Y. In this case, the constituent Y constitutes that component of the solder containing two or more components which is consumed during the soldering operation by reacting or being dissolved in the layers which are to be joined. The same applies, mutatis mutandis, to multi-component systems.

A particularly preferred, low-melting solder is in this case an AuSn solder with a hypereutectic concentration of tin. The AuSn solder preferably contains more than 20% by weight Sn.

The invention offers in particular the below listed advantages.

Compared to the known eutectic AuSi or eutectic AuGe solders which are vapor-deposited on the rear side of the wafer, the use of an AuSn solder with a hypereutectic Sn concentration provides chip-alloying temperatures which are up to 100° Celsius lower, and therefore considerably reduced thermal stresses, and consequently a lower risk of the chip breaking. Furthermore, the invention allows improved homogeneity and wetting of the solder layer.

Compared to a eutectic AuSn solder, the invention has the advantage above all of a lower alloying temperature. During the coating and mounting process, the Sn content of the eutectic AuSn falls, since both the required barrier between AuSn and Si and the lead frame surface (for example containing Ag) absorb Sn during mounting. Consequently, the melting temperature of the AuSn solder rises. Particularly in the case of sputtered eutectic AuSn, the alloying temperature that is required for joining is almost as high as that of an AuSi alloy.

Compared to epoxy adhesives, the invention provides the advantage of improved thermal conductivity of the joint, improved homogeneity of the joint, and above all saving on the adhesive and bonding process during mounting.

Compared to soldering with a preform, the method according to the invention provides above all a reduction in costs during mounting.

Preferably, the solder is deposited on the rear side of the chip, in particular by sputtering. Naturally, this takes place in the wafer composite of the semiconductor chips, so that the term chip also encompasses the chip that is still in the wafer composite.

It is particularly advantageous for the deposition to have a composition by weight of the constituents X to Y of 70 to 30, i.e. preferably a composition of AuSn=70/30. The layer of solder is sputtered onto the rear side of the wafer with a thickness of from about 1 µm to about 2 µm, preferably of about 1.5 µm.

Other features which are considered as characteristic for the invention are set forth in the appended claims.

Although the invention is illustrated and described herein as embodied in a method and an apparatus for producing a chip-substrate connection, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
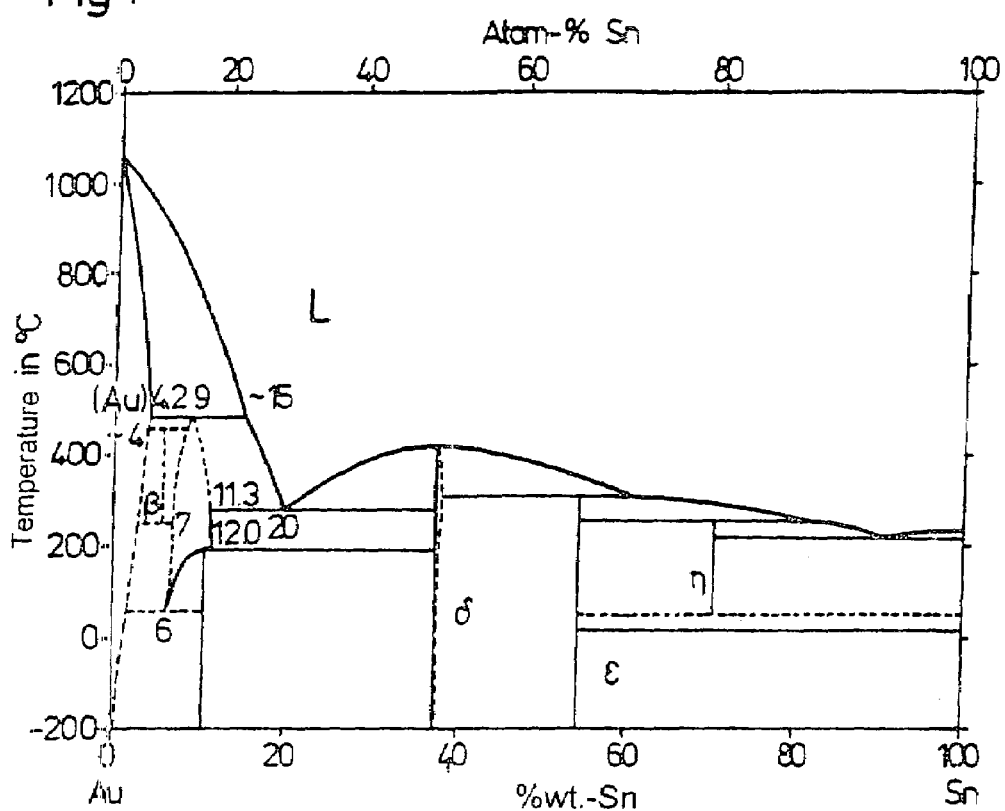
FIG. 1 is a phase diagram of AuSn.

In all the figures of the drawing, sub-features and integral parts that correspond to one another bear the same reference symbol in each case. Referring now to the figures of the drawing in detail and first, particularly, to FIG. 1 thereof, there is shown that for an AuSn composition the eutectic temperature is 278° Celsius, and a specific composition contains 20% Sn and 80% Au (percent by weight). Therefore, alloy formation takes place at a temperature that lies well below the melting temperature of the individual components. In accordance with the fundamental concept of the invention, an AuSn solder with a hypereutectic concentration of tin is used, so that the AuSn solder contains more than 20% by weight Sn. The result is a sufficiently low viscosity of the solder at temperatures of below 380° Celsius for mounting in surface mounting devices or SOT housings, since diffusion of Sn into adjoining layers of metal causes the composition of the AuSn to move away from the tin-rich phase toward the eutectic point, so that a gold-rich solder phase which lies above the eutectic is avoided. The melting temperature of the AuSn mixture rises very steeply if Au is in excess, while the increase in the melting point is significantly less if the mixture is enriched with Sn. A loss of Sn from an Sn-rich solder according to the invention results in a continuous reduction in the melting point during the soldering operation, thus promoting the soldering operation. The melting temperature is reduced locally in particular at the contact point between solder and a lead frame (for example Ag), where the Sn depletion takes place, thus improving the flow properties of the solder. For this reason, an excess supply of Sn results in reproducible mounting conditions at low temperatures. This effect is greatly emphasized in particular in the case of thin layers of solder, as are conventionally used when coating the rear side of wafers.

Figure 2A:
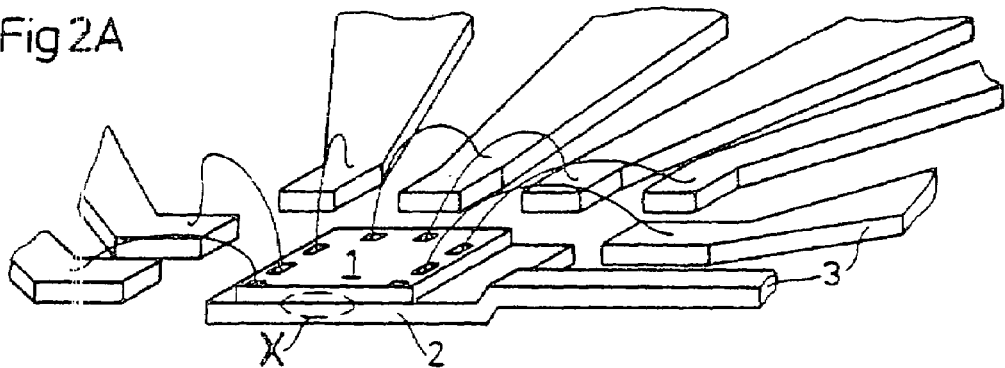
FIG. 2A is a fragmented, perspective view of a semiconductor chip which has been alloyed on a lead frame using a hypereutectic AuSn solder according to the invention.
Figure 2B:
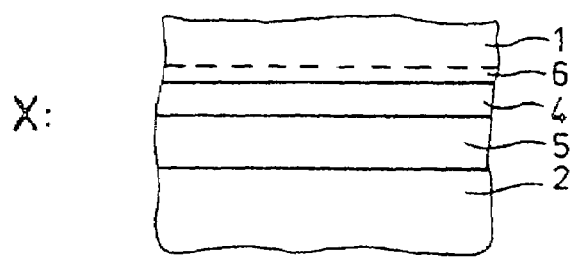
FIG. 2B a diagrammatic, enlarged, sectional view of detail X from FIG. 2A.

FIGS. 2A and 2B show a connection between a semiconductor chip 1 on a central "island" 2 of a metallic lead frame 3, which is produced by alloying or brazing. The prefabricated metallic lead frames 3 represent a very widespread form of substrate, in particular for use in plastic housings. The enlarged partial view shown in FIG. 2B shows the sequence of layers in more detail. A rear side of the semiconductor chip 1 is provided with an adhesion or diffusion barrier 4, which preferably contains Ti/Pt. Reference numeral 5 denotes a layer of solder that has been sputtered onto the rear side of the wafer with a thickness of typically 1.5 µm. To allow the chip-substrate connection to have a sufficiently low resistance, it may be necessary for a doping layer, for example of AuAs, or a contact implantation 6 also to have been incorporated beforehand.

We claim:

1. A method for producing a chip-substrate connection, which comprises:
   performing one of alloying and brazing a chip to a substrate using a solder containing at least two components with at least two metal-containing constituents including a first constituent X containing a precious metal and a second constituent Y being consumed in a soldering operation by one of reacting and being dissolved by materials being joined, and the solder having a hypereutectic concentration of the second constituent Y.

2. The method according to claim 1, which comprises providing the second constituent Y of the solder with tin having the hypereutectic concentration.

3. The method according to claim 1, which comprises using a gold-tin compound (AuSn) as the solder with a hypereutectic Sn concentration.

4. The method according to claim 3, which comprise providing the gold-tin compound a tin concentration being greater than 20% by weight.

5. The method according to claim 1, which comprises depositing the solder on a rear side of the chip.

6. The method according to claim 5, which comprises providing the solder with a composition by weight of the first constituent X to the second constituent Y of 70 to 30.

7. The method according to claim 5, which comprises applying the solder with a thickness of from about 1 µm to about 2 µm to the rear side of the chip.

8. The method according to claim 1, which comprises using gold as the precious metal.

9. The method according to claim 1, which comprises depositing the solder on a rear side of the chip by sputtering.

10. The method according to claim 5, which comprises applying the solder by sputtering with a thickness of about 1.5 µm to the rear side of the chip.

11. A method for producing a chip-substrate connection, which comprises:
   providing a substrate;
   providing a chip having incorporated therein a doping layer or a contact implantation and a rear side and an adhesive or diffusion barrier containing Ti/Pt and being provided on the rear side;
   performing one of alloying and brazing the chip to the substrate by depositing a solder at the rear side of the chip directly on the adhesive or diffusion barrier to form a chip-substrate connection by the solder, the solder containing at least two components with at least two metal-containing constituents including a first constituent X containing a precious metal and a second constituent Y being consumed in a soldering operation by one of reacting and being dissolved by materials being joined, and the solder having a hypereutectic concentration of the second constituent Y.

12. The method of claim 11, wherein the solder contains a gold-tin compound (AuSn) having a composition by weight of Au to Sn of initially 70 to 30.

13. The method of claim 12, wherein the solder forms a layer having a thickness of from about 1 µm to about 2 µm.

14. The method according to claim 11, which comprises depositing the solder at the rear side of the chip by sputtering.

15. The method according to claim 11, which comprises applying the solder by sputtering with a thickness of about 1.5 µm to the rear side of the chip.

16. A method for producing a chip-substrate connection, which comprises:
providing a substrate;
providing a chip having incorporated therein a doping layer or a contact implantation and a rear side and an adhesive or diffusion barrier containing Ti/Pt and being provided on the rear side;
performing one of alloying and brazing the chip to the substrate by depositing a solder at the rear side of the chip directly on the adhesive or diffusion barrier to form a chip-substrate connection by the solder, the solder containing at least two components with at least two metal-containing constituents including a first constituent X containing a precious metal and a second constituent Y being consumed in a soldering operation by one of reacting and being dissolved by materials being joined, and the solder having a hypereutectic concentration of the second constituent Y, the solder containing a gold-tin compound (AuSn) having a composition by weight of Au to Sn of initially 70 to 30 and forming a layer having a thickness of from about 1 µm to about 2 µm, Sn contained in the solder diffusing away from the solder into adjoining layers, loss of Sn providing a continuous reduction in a melting temperature during a soldering procedure, resulting in a metallic layer bonded to the semiconductor chip and the substrate, said metallic layer containing Sn.

17. The method according to claim 16, which comprises depositing the solder at the rear side of the chip by sputtering.

18. The method according to claim 16, which comprises applying the solder by sputtering with a thickness of about 1.5 µm to the rear side of the chip.

* * * * *

UNITED STATES PATENT AND TRADEMARK OFFICE
CERTIFICATE OF CORRECTION

PATENT NO. : 7,442,582 B2  Page 1 of 1
APPLICATION NO. : 11/842656
DATED : October 28, 2008
INVENTOR(S) : Hansjörg Reichert et al.

It is certified that error appears in the above-identified patent and that said Letters Patent is hereby corrected as shown below:

Title Pg, Please insert Item (30) to Read:
-- (30)     Foreign Application Priority Data
       July 14, 1997     (DE)   .......................197 30 118 --.

Signed and Sealed this

Fourteenth Day of April, 2009

JOHN DOLL
*Acting Director of the United States Patent and Trademark Office*